(12) United States Patent
Ngo

(10) Patent No.: US 6,943,599 B2
(45) Date of Patent: Sep. 13, 2005

(54) METHODS AND ARRANGEMENTS FOR A LOW POWER PHASE-LOCKED LOOP

(75) Inventor: Hung Cai Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/733,933

(22) Filed: Dec. 10, 2003

(65) Prior Publication Data

US 2005/0127961 A1    Jun. 16, 2005

(51) Int. Cl.[7] ............................................. H03L 7/06
(52) U.S. Cl. ........................ 327/156; 327/159; 331/60
(58) Field of Search ................................. 327/154–159; 331/57, 60, 111, 143

(56) References Cited

U.S. PATENT DOCUMENTS

| | | | |
|---|---|---|---|
| 5,059,924 A * | 10/1991 | JenningsCheck | 331/1 A |
| 5,712,582 A * | 1/1998 | Yokota et al. | 327/156 |
| 6,157,694 A | 12/2000 | Larsson | |
| 6,424,192 B1 * | 7/2002 | Lee et al. | 327/156 |
| 6,441,667 B1 | 8/2002 | Boerstler et al. | |
| 6,522,207 B1 * | 2/2003 | Boerstler et al. | 331/25 |
| 6,791,379 B1 * | 9/2004 | Wakayama et al. | 327/156 |
| 2003/0189445 A1 | 10/2003 | Ngo | |

* cited by examiner

Primary Examiner—Tuan T. Lam
Assistant Examiner—An T. Luu
(74) Attorney, Agent, or Firm—Casimer K. Salys; Jeffrey S. Schubert

(57) ABSTRACT

Methods and arrangements for a low power, phase-locked loop (PLL) are disclosed. Embodiments include a multi-phase oscillator like a voltage-controlled oscillator (VCO) to generate multiple phases of a clock signal. The multiple phases are then combined to generate a single clock signal having a frequency substantially equivalent to the number of phases multiplied by the frequency of the clock signal generated by the multi-phase VCO. Advantageously, embodiments can generate clock signals having frequencies that are multiples of the frequency generated by the VCO, reducing the power consumed by the VCO to produce a clock signal having the same frequency as a clock signal generated by a single phase VCO. Further, the achievable frequency for the VCO is increased. In many embodiments, a high speed, n-bit frequency divider that implements a pulse latch facilitates the use of the multi-phase VCO to generate the very high frequency clock signals.

19 Claims, 6 Drawing Sheets

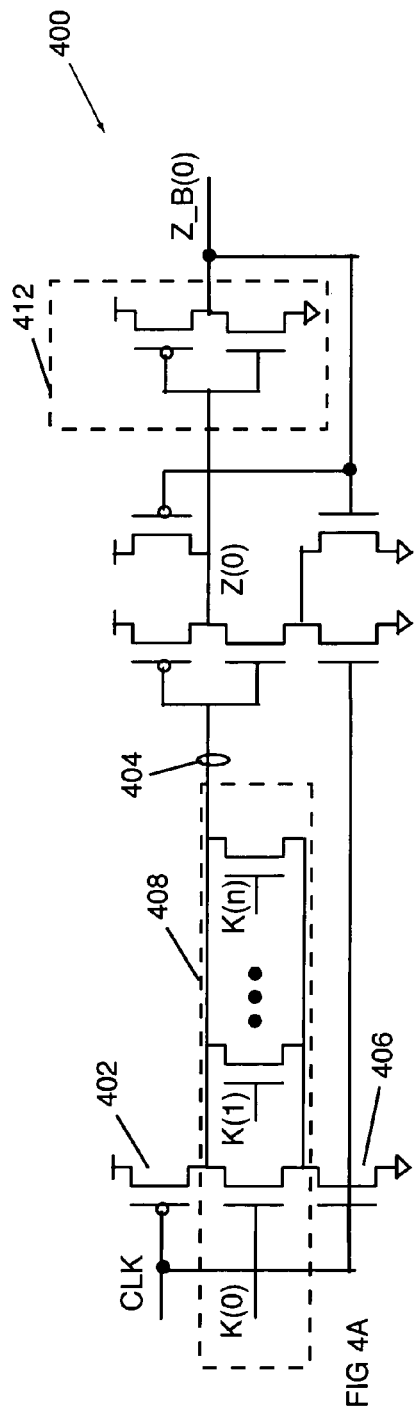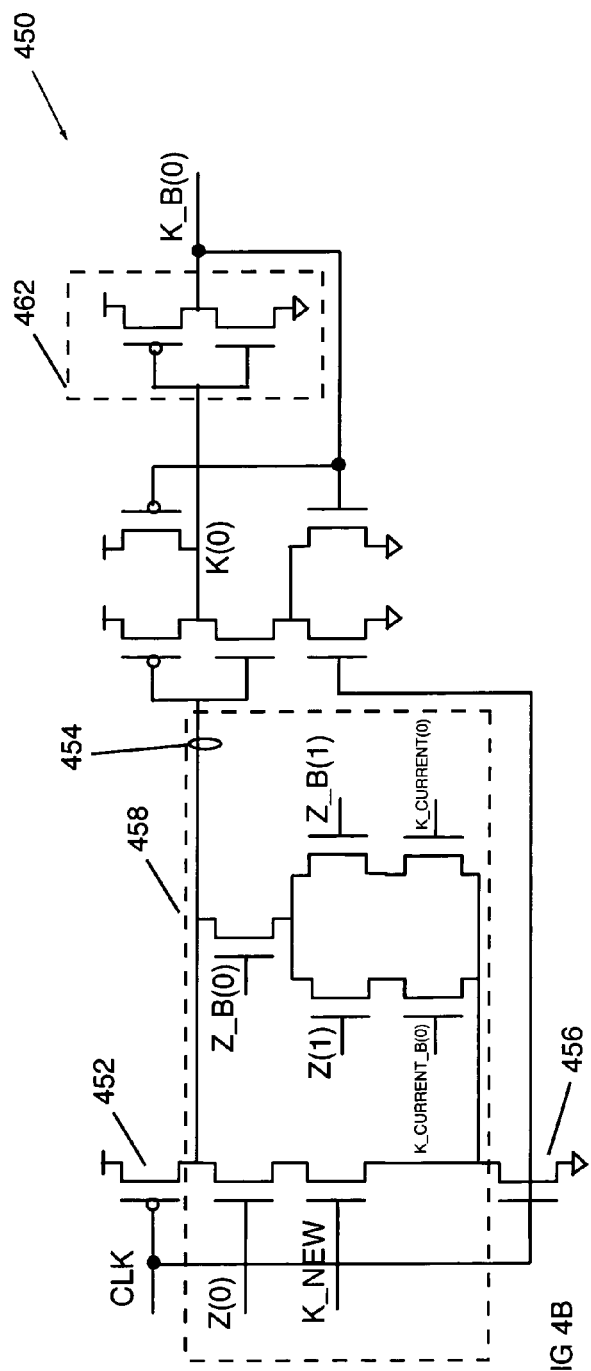
FIG 4A
FIG 4B

METHODS AND ARRANGEMENTS FOR A LOW POWER PHASE-LOCKED LOOP

CROSS-REFERENCES TO RELATED APPLICATIONS

This application is related to U.S. patent application Ser. No. 10/116,612, Published Document No. 20030189445, entitled "CIRCUITS AND SYSTEMS FOR LIMITED SWITCH DYNAMIC LOGIC", filed on Apr. 4, 2002, the disclosure of which is incorporated herein in its entirety for all purposes.

FIELD OF INVENTION

The present invention is in the field of clock circuits. More particularly, the present invention relates to methods and arrangements for a low power phase-locked loop (PLL) circuit to achieve higher frequencies than a conventional PLL circuit implemented as a single phase, voltage controlled oscillator (VCO).

BACKGROUND

Clock generation for digital systems generally requires clock frequencies that are stable, and in many cases the digital system clock frequencies are related by integer multiples. Typically, the master clock starts as the output of a crystal-controlled oscillator, and then various shaping circuits generate a digital version of the oscillator output. These shaping circuits provide fast rise and fall times as well as symmetry between the two halves of the clock period.

Many times, a phase lock loop (PLL) is used with a voltage-controlled oscillator (VCO) in a feedback loop to generate a high frequency clock from a lower frequency clock. In this way, the stable master clock is of a lower frequency that may be easier to generate. More specifically, the PLL may employ a VCO and a phase detector. The stable, lower frequency clock is input into the PLL circuit as a reference clock. The phase detector compares the phase of the reference clock with the phase of a feedback clock signal having a comparable frequency. The feedback clock is the clock signal output by the PLL but divided to be the frequency of the reference clock if the frequency of the output is correct. When the frequency or phase of the feedback clock is different from the reference clock, the voltage applied to the VCO is varied, increasing or decreasing the phase/frequency output by the VCO based upon the difference between the reference clock and the feedback clock signals.

VCOs are commonly implemented using one or more integrated circuits (ICs) in topologies such as a ring oscillator topology. The ring oscillator topology provides a series of cascaded delay stages, where the output signal from the last delay stage is fed back to the input of the first delay stage. Total delay through the cascaded stages (plus any net inversion of the signal within the system) is designed to satisfy criteria for sustained oscillation. Typically each delay stage has a variable delay governed by an independent input, and oscillation frequency is controlled using such input to vary stage delay. The oscillation frequency for a ring counter can be tuned over a fairly wide range, perhaps 20% to 50% of the nominal center frequency.

With the output frequency of the VCO being divided for comparison with the reference clock, the frequency of the signal output by the PLL circuit can be higher than the frequency of the reference clock. However, generating a high frequency signal with a VCO in this manner is limiting because VCOs can only generate certain frequency ranges and the internal frequencies utilized by conventional processors and data transmission systems are approaching those limits. Further, operation of the VCOs at high frequencies, approaching the physical limitations of VCOs, consumes a significant amount of power.

There is, therefore, a need for a way to generate high frequency clock signals using a VCO and to operate the VCO at a lower frequency to conserve power.

SUMMARY OF THE INVENTION

The problems identified above are in large part addressed by methods and arrangements for a low power phase locked loop circuit. One embodiment provides a phase locked loop circuit. The phase-locked loop circuit contemplates a multi-phase voltage controlled oscillator to generate more than one phase of an oscillator clock signal based upon an input voltage; a pulse generator coupled with the multi-phase voltage controlled oscillator to combine the phases of the oscillator clock signal to generate a loop clock signal; and a comparison circuit coupled with the pulse generator to modify the input voltage based upon a comparison of the loop clock signal with a reference clock signal.

Another embodiment provides a frequency divider. The frequency divider contemplates a latch to receive a divisor having at least one bit; a decrementer circuit to count a number of transitions of a clock signal and to output a pulse when the number reaches the divisor; and a pulse latch circuit to transition an output voltage in response to receipt of the pulse, to generate an output clock signal having a frequency of the clock signal divided by the divisor.

Another embodiment provides a method for generating an output clock signal based upon a reference clock signal. The method generally includes generating phases of an oscillator clock signal based upon an input voltage, wherein the input voltage results from a comparison of the output clock signal and a reference clock signal; generating pulses in response to transitions associated with the phases of the oscillator clock signal; and combining the pulses to generate the output clock signal.

BRIEF DESCRIPTION OF THE DRAWINGS

Other objects and advantages of the invention will become apparent upon reading the following detailed description and upon reference to the accompanying drawings in which, like references may indicate similar elements:

FIGS. 4A–B depict embodiments of circuits to implement the high-speed frequency divider such as the frequency divider in FIG. 3;

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements for a low power phase-locked loop (PLL) are contemplated. Embodiments include a multi-phase, voltage-controlled oscillator (VCO) to generate multiple phases of a clock signal. The multiple phases of the clock signal are then combined to generate a single clock signal having a frequency substantially equivalent to the number of phases multiplied by the frequency of the clock signal generated by the multi-phase VCO. Advantageously, embodiments of the present invention can generate clock signals having frequencies that are multiples of the frequency generated by the VCO, reducing the power consumed by the VCO to produce a clock signal having the same frequency as a clock signal generated by a single phase VCO. Further, the achievable frequency for the VCO is increased.

A high speed, n-bit frequency divider that implements a pulse latch facilitates the use of the multi-phase VCO to generate the very high frequency clock signals. The frequency divider receives a divisor substantially equivalent to the difference between the frequency of the reference clock signal and the frequency to output by the VCO. In many embodiments, the frequency divider decrements a count represented by the divisor and pulses a latch each time the count is decremented to zero to transition the voltage of the output clock signal from low to high or high to low.

While specific embodiments will be described below with reference to particular circuit configurations of PLL, frequency divider and other components, those of skill in the art will realize that embodiments of the present invention may advantageously be implemented with other substantially equivalent circuit configurations.

Figure 1:
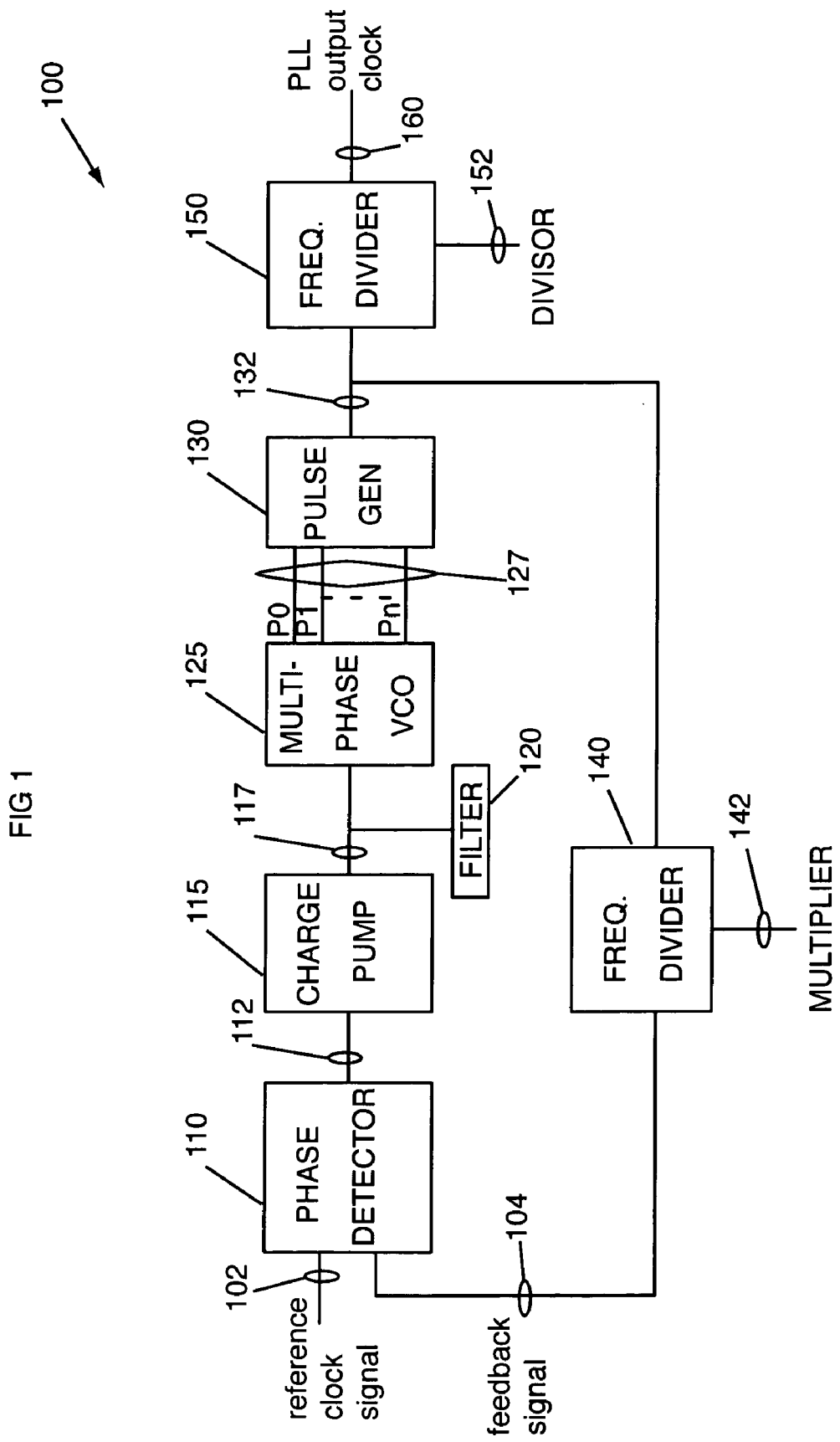
FIG. 1 depicts an embodiment of a low-power PLL having a multi-phase voltage controlled oscillator (VCO) such as a ring oscillator and high-speed frequency dividers.

Turning now to the drawings, FIG. 1 depicts an embodiment of a low power phase-locked loop (PLL) circuit 100 having a relatively low frequency voltage-controlled oscillator (VCO) to generate a relatively high frequency clock signal. More specifically, PLL 100 includes phase detector 110, charge pump 115, filter 120, multi-phase VCO 125, pulse generator 130, frequency divider 140 and frequency divider 150 to generate a PLL clock signal 160 based upon a reference clock signal 102. For example, PLL circuit 100 may provide a clock signal for a high-speed processor.

Phase detector 110 may compare the rising edges of reference clock signal 102 and the feedback clock signal 104 to generate a high-speed comparison signal 112. The high-speed comparison signal may include a charge signal and a discharge signal to cause the charge pump 115 to increase the voltage or decrease the voltage of the charge pump signal 117. In many embodiments, the multi-phase VCO 125 may change the phase and frequency of phases P0 through Pn of a clock signal, up or down, in response to changes in the charge pump signal 117. In particular, reference clock 102 may be in the frequency range of ten to thirty MegaHertz (MHz) and the feedback clock signal 104 may be in a similar frequency range and be descriptive of the output of the output of the pulse generator 130.

In some embodiments, the phase detector 110 may also filter the high-speed comparison used to generate the high-speed comparison signal 112 to reduce the frequency of changes in the high-speed comparison signal 112. For example, phase detector 110 may execute multiple comparisons between the reference clock signal 102 and the feedback signal 104, and average the results of the comparisons to determine whether to instruct charge pump 115 to increase the voltage or decrease the voltage at multi-phase VCO 125.

Charge pump 115 receives up/down charge signal 112 and adjusts the voltage of charge pump signal 117 accordingly. Thus, when the feedback control signal is at a higher frequency than the reference clock signal 102, phase detector 110 may output a down charge signal, instructing charge pump 115 to reduce the voltage being output to multi-phase VCO 125. On the other hand, when the feedback clock signal 104 is at a lower frequency than reference clock signal 102, phase detector 110 may output an up charge signal to instruct charge pump 115 to increase the voltage of charge pump signal 117.

Filter 120 may include, e.g., a capacitor and a resistor. The capacitor and resistor may be sized based upon a design calculation and/or heuristically determined by circuit simulations.

Multi-phase VCO 125 may include a ring oscillator designed to oscillate at a frequency dependent upon the voltage of charge pump signal 117. Multi-phase VCO 125 outputs P0 through Pn phases at a frequency that is up to n+1 times slower than the frequency desired for PLL clock 160, wherein n+1 is the number of phases output by multi-phase VCO 125. In other words, the frequency output of multi-phase VCO 125 can be n+1 times slower than the desired or expected frequency output.

Pulse generator 130 combines the multiple phases, P0 through Pn, of outputs from multi-phase VCO 125 to generate a single phase, pulse generator signal 132. Advantageously, generating multiple phase signals, P0 through Pn, to generate a high frequency, PLL clock signal 160, allows multi-phase VCO 125 to operate at a lower frequency than a corresponding, single phase VCO that operates near the frequency of PLL clock signal 160, reducing power consumption by multi-phase VCO 125. Further, VCOs in general have physical limitations that limit the ability to achieve very high frequencies. However, the frequencies achievable by the present embodiment are limited by the number of phases available for multi-phase VCO 125 times the frequency limitation of the multi-phase VCO 125. In other embodiments, more than one multi-phase VCO 125 may be implemented to increase the number of phase signals and the frequency range capabilities of PLL circuit 100.

Frequency divider 140 in the feed back loop may reduce the frequency of the pulse generator signal 132 when the reference clock 102 is slower than pulse generator signal 132 based upon multiplier signal 142. For example, reference clock 102 may be in the frequency range of ten MHz. On the other hand, multi-phase VCO 125 may cooperate with pulse generator 130 to output a pulse generator signal 132 in a frequency range around one GigaHertz (GHz). Thus, frequency divider 140 may divide the pulse generator signal 132 by 100 to provide feedback clock signal 104, facilitating adjustment of the frequency and phase of the pulse generator signal 132.

In many embodiments, frequency divider 150 in included at the output of the low power PLL circuit 100 to dynamically adjust the frequency of the pulse generator signal 132.

For instance, divisor signal 152 can be modified to change the frequency of the PLL clock signal 160 on the fly or when the desired frequency is different from the reference clock frequency by, e.g., a fraction.

Figure 2A:
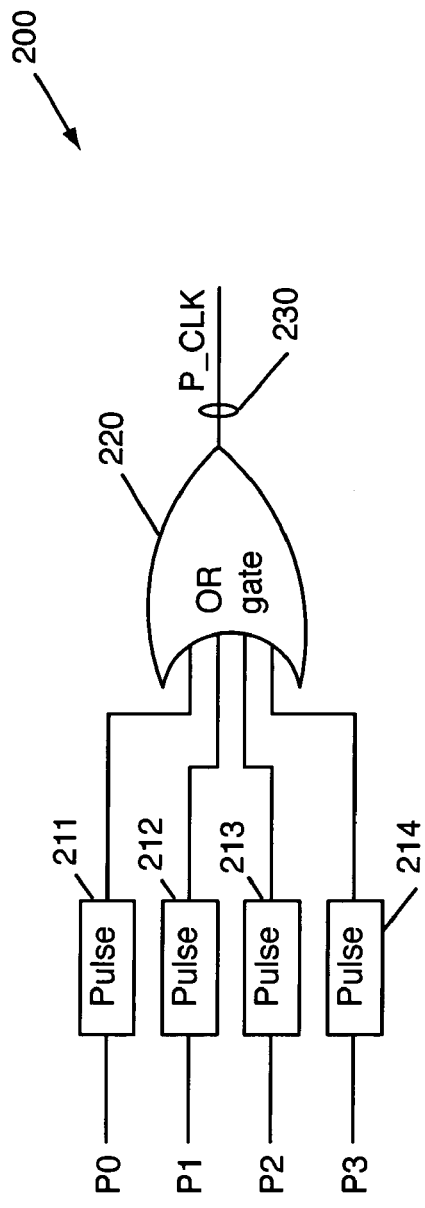
FIGS. 2A–B depicts an example of a pulse generator for the embodiment shown in FIG. 1 having four phase signal inputs and the corresponding clock diagram.
Figure 2B:
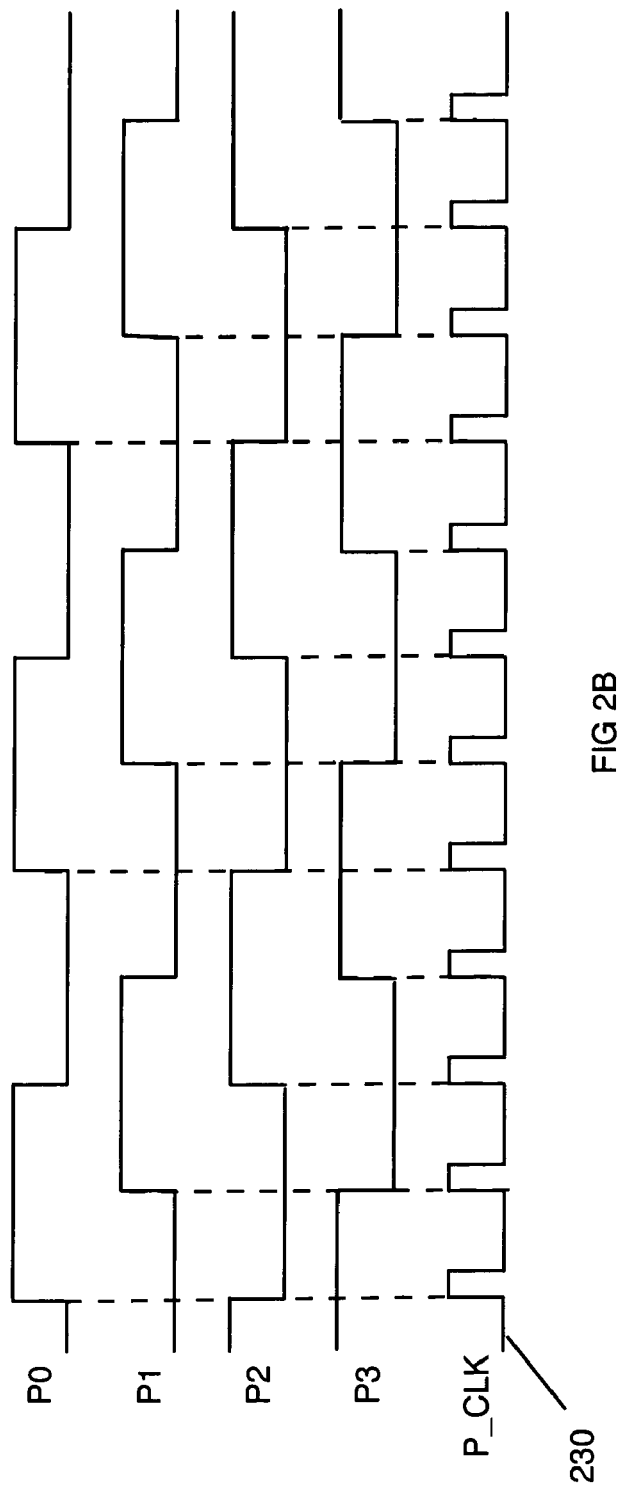

FIG. 2A depicts an example pulse generator 200 for the pulse generator 130 of PLL circuit 100 in FIG. 1 and FIG. 2B is clock diagram to describe an example of the input signals, phases P0 through P3, and the resulting output signal, or pulse generator signal, when pulses are generated based upon the rising edges of phase signals P0 through P3. In particular, pulse generator 200 is configured to receive four phase signals phase signals, P0 through P3, from a multi-phase VCO like multi-phase VCO 125 from FIG. 1. Each phase signal, P0 through P3, initiates a pulse having a defined pulse width and the OR gate 220 combines the pulses to generate the pulse generator signal. For example, upon receipt of a rising edge of phase signal P0, pulse 211 initiates a pulse and turns off the pulse after the delay. Similarly, pulse 212 through 214 initiate pulses on the rising edge of phase signals P1 through P3, respectively, and stop the pulses after the pre-defined delay. OR gate 220 then combines the pulses to generate the pulse generator signal 230.

Figure 3:
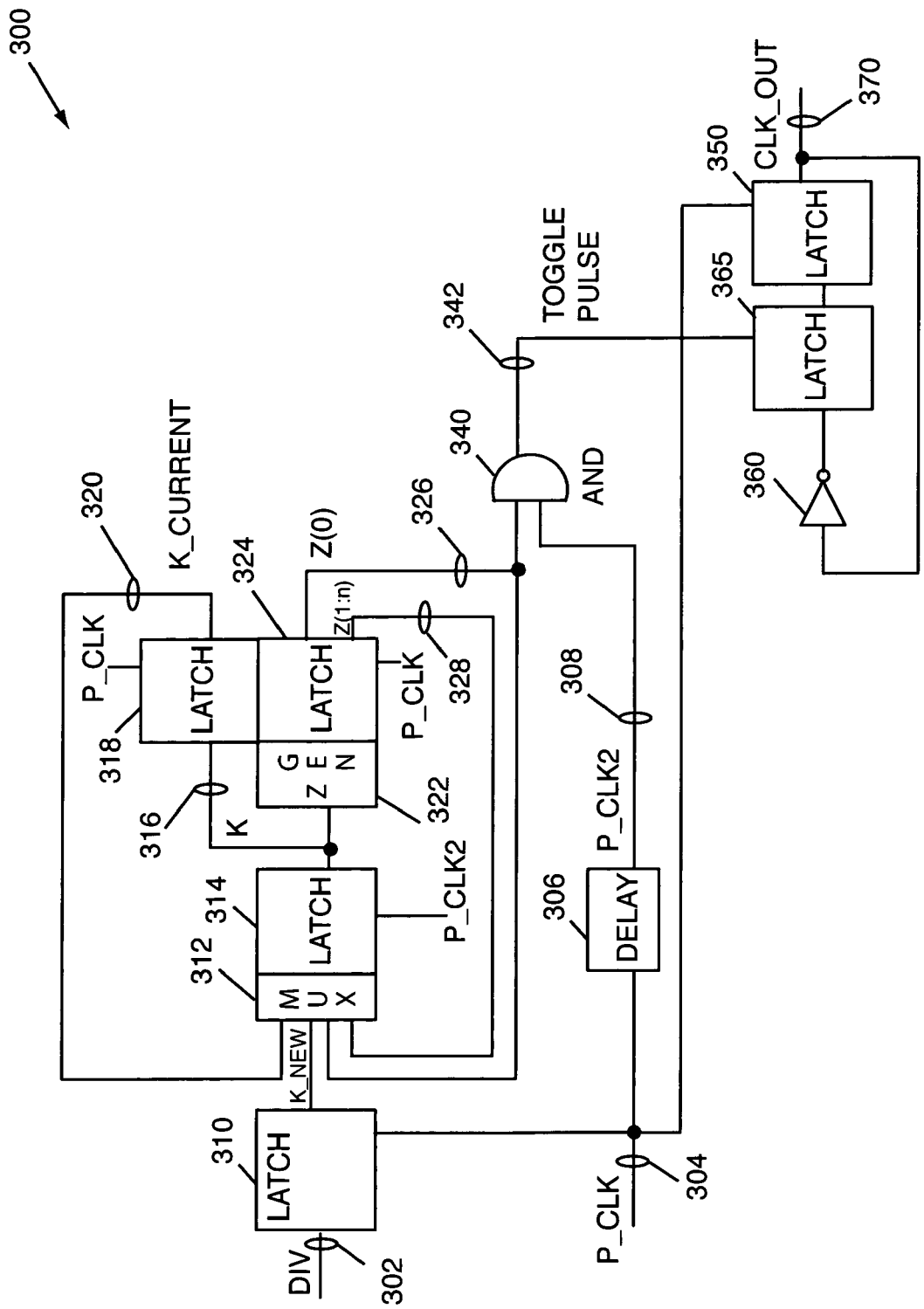
FIG. 3 depicts an embodiment of a high-speed frequency divider such as the frequency dividers in FIG. 1, implemented via a pulse latch.

Turning now to FIG. 3, there is shown a high-speed, n-bit frequency divider 300 such as frequency divider 140 and frequency divider 150 in FIG. 1. In the present embodiment, frequency divider 300 produces a 50% duty cycle clock. Further embodiments include variations of the duty cycle and may be similarly designed. In general, frequency divider 300 functions as a decrementer, counting clock transitions of clock signal, P_CLK 304, and implements a pulse latch to modify the output clock signal 370 either up or down after a number of clock transitions determined by the n-bit value of divisor 302. Each four pulses, the output clock signal 370 transitions between a high voltage and a low voltage.

The input clock signal, P_CLK 304, is delayed by delay 306 to generate a delayed clock signal, P_CLK2 308. Delay 306 is designed to allow sufficient time for data to pass through latch 324. For example, first count may be gated through latch 318 to multiplexer 312 in response to a rising edge of P_CLK 304 and then, after the delay 306, a second count may be gated through to latch 318 from latch 314 based upon a rising edge of P_CLK2 308.

Divisor signal 302 includes a new count, or K_new(0). K_new(0) may be binary and is latched to multiplexer 312 to initiate a count down that divides the frequency of P_CLK 304. Latch 314 gates K_new(0) to latch 318 and Z generator 322 in response to a transition of P_CLK2 308, which is a transition of P_CLK 304 as delayed by delay 306. Then, latch 318 gates K_new(0) back to multiplexer 312 as the current count.

Z generator 322 determines whether the new count has been decremented to zero. More specifically, Z generator 322 determines that K_new is not zero and gates a signal Z(1:n) 328 back to multiplexer 312. The signal Z(1:n) 328 instructs multiplexer 312 to decrement K_CURRENT 320 by one to generate K 316. For example, when K_CURRENT 320 is binary bits "11", K 316 would be binary bits "10", or three. In response, multiplexer 312 outputs K 316 via latch 314 to latch 318 and Z generator 322. K_CURRENT 320 is latched back to multiplexer 312 as the current count and Z(1:n) 328 is gated back to multiplexer 312 via latch 324, which causes multiplexer 312 to decrement K_CURRENT 320 to generate K 316, or binary bits "01", and so on.

In the present embodiment, the output of Z generator 322 is determined by the following equations:

$$Z(0)=K\_B(1)K\_B(2) \ldots K\_B(n-1)K\_B(n)$$

$$Z(1)=K\_B(2)K\_B(3) \ldots K\_B(n-1)K\_B(n)$$

$$Z(2)=K\_B(3)K\_B(4) \ldots K\_B(n-1)K\_B(n)$$

$$\vdots$$

$$Z(n-1)=K\_B(n)$$

$$Z(n)="1"$$

Note that "_B" means "bar" or the inverted value so, e.g., Z_B(n) refers to the inverted value of Z(n) and K_B(n) refers to the inverted value of K(n).

Also, in the present embodiment, multiplexer 312 decrements the count by implementing the following equations:

$$K(0)=Z(0)K\_new(0)+Z\_B(0)[Z(1)K\_current\_B(0)\\ +Z\_B(1)K\_current(0)]$$

$$K(1)=Z(0)K\_new(1)+Z\_B(0)[Z(2)K\_current\_B(1)\\ +Z\_B(2)K\_current(1)]$$

$$K(2)=Z(0)K\_new(2)+Z\_B(0)[Z(3)K\_current\_B(2)\\ +Z\_B(3)K\_current(2)]$$

$$\vdots$$

$$K(n-1)=Z(0)K\_new(n-1)+Z\_B(0)[Z(n)K\_current\_B\\ (n-1)+Z\_B(n)K\_current(n-1)]$$

$$K(n)=Z(0)K\_new(0)+Z\_B(0)[Z\_B(1)+K\_current\_B\\ (n)]$$

The first equation can be simplified to this for clarity:

$$K(0)=Z(0)K\_new(0)+Z\_B(0)[Z\_B(1)K\_current(0)]$$

For K(0) through K(n-1), when Z(0) is equal to zero or disabled, the values of K_new(0) through K_new(n-1) do not factor into the value of the count as the count is decremented from K_new to zero. In particular, Z_B(0) is the inverted value of Z(0) so Z_B(0) is one while Z(0) is zero and vice versa.

FIG. 4A illustrates an embodiment of a Z generator circuit 400 such as Z generator 322 in FIG. 3 to implement the equation Z(0)=K_B(1) K_B(2) . . . K_B(n-1) K_B(n). More specifically, Z generator circuit 400 is a limited switch dynamic logic (LSDL) circuit that maintains a static output unless the Boolean logic, logic tree 408, changes the output, Z(0) and thus, also Z_B(0). In the present embodiment, logic tree 408 implements the equation for Z(0) by coupling logic transistors of logic tree 408 in parallel, having inputs of K(0) through K(n). If one of the signals K(0) through K(n) is a high voltage or a binary bit of "1", the pre-charge placed on domino node 404 by pre-charge transistor 402 is discharged through logic tree 408 and clock transistor 406 when clock signal CLK is a high voltage.

The transition from high to low voltage by domino node 404 changes the output of Z(0) from a low voltage to a high voltage. The functionality of LSDL 400 is discussed in detail in U.S. patent application Ser. No. 10/116,612, cross-referenced above and incorporated herein by reference.

An inverter 412 coupled with the output of Z(0) from LSDL 400 generates Z_B(0) and, in some embodiments, a second inverter may be implemented to generate Z(0). Otherwise, Z(0) may be output from circuit 400.

FIG. 4B illustrates an embodiment of a multiplexer circuit 450 such as multiplexer circuit 312 in FIG. 3 to implement the equation K(0)=Z(0) K_new(0)+Z_B(0)[Z(1) K_current_B(0)+Z_B(1) K_current(0)]. In particular, circuit 450 is a LSDL like circuit 400 above that maintains a static output unless the Boolean logic, logic tree 458, changes the output, K(0) and thus, K_B(0). In the present embodiment, logic tree 458 implements the equation for K(0) by coupling logic transistors of logic tree 408 implementing the product Z(0) K_new(0) in parallel with the logic transistors implementing the product Z_B(0)[Z(1) K_current_B(0)+Z_B(1) K_current(0)]. To produce the product Z(0) K_new(0), the channels of logic transistors having gates coupled with Z(0) and K_new(0) are coupled in series between the domino node 454 and the low voltage source via clock transistor 456. Thus, if both Z(0) and K_new(0) are high voltages, domino node 454 is discharged.

Similarly, the channel of Z_B(0) is coupled in series with channels of logic transistors implementing the product of Z(1) K_current_B(0) and the product of Z_B(1) K_current(0) to employ the second product of the equation for K(0). If either conductive path through logic tree 458 is created, the charge placed on domino node 454 by precharge transistor 452 is discharged through logic tree 458 and clock transistor 456 when clock signal CLK is a high voltage.

The transition from high to low voltage by domino node 454 changes the output of K(0) from a low voltage to a high voltage.

An inverter 462 coupled with the output of K(0) from LSDL 450 generates K_B(0) and, in some embodiments, a second inverter may be implemented to generate K(0). Otherwise, K(0) may be output from circuit 450.

Referring again to FIG. 3, after the count K 316 is decremented to zero, Z generator 322 gates Z(0) 326 via latch 324 to multiplexer 312 and AND gate 340. Upon receipt of Z(0) 326, multiplexer 312 gates the value of divisor signal 302 latched at latch 310 to latch 318 and Z generator 322 via latch 314.

AND gate 340 may generate a toggle signal 342 via clock signal 308 and Z(0) 326. P_CLK 304 is delayed by delay 306 to generate P_CLK2 308. P_CLK2 308 is combined via AND logic 340 with Z(0) 328 to generate the toggle signal 342. Thus, when the count of K_new is decremented to zero, Z(0) 328 is enabled for a delay defined by delay 306, enabling the output of AND gate 340 to transition the toggle signal 342 to high for the extent of the delay.

Toggle signal 342 may be designed to indicate that the output clock signal 370 is to be toggled. Toggle signal 342 transitions each time the count of clock pulses for P_CLK 304 has reached the number of transitions represented by divisor 302. Thus, toggle signal 342 indicates to latch 365 that the output clock signal 370 should also transition. In particular, the toggle signal 342 enables latch 365, gating the inverted output clock signal 370 output by inverter 360 to latch 350. Then, when P_CLK 304 rises, latch 350 gates the inverted output clock signal 370, causing the output clock signal 370 to either rise or fall, transitioning from low to high voltage or high to low voltage, respectively.

Figure 5:
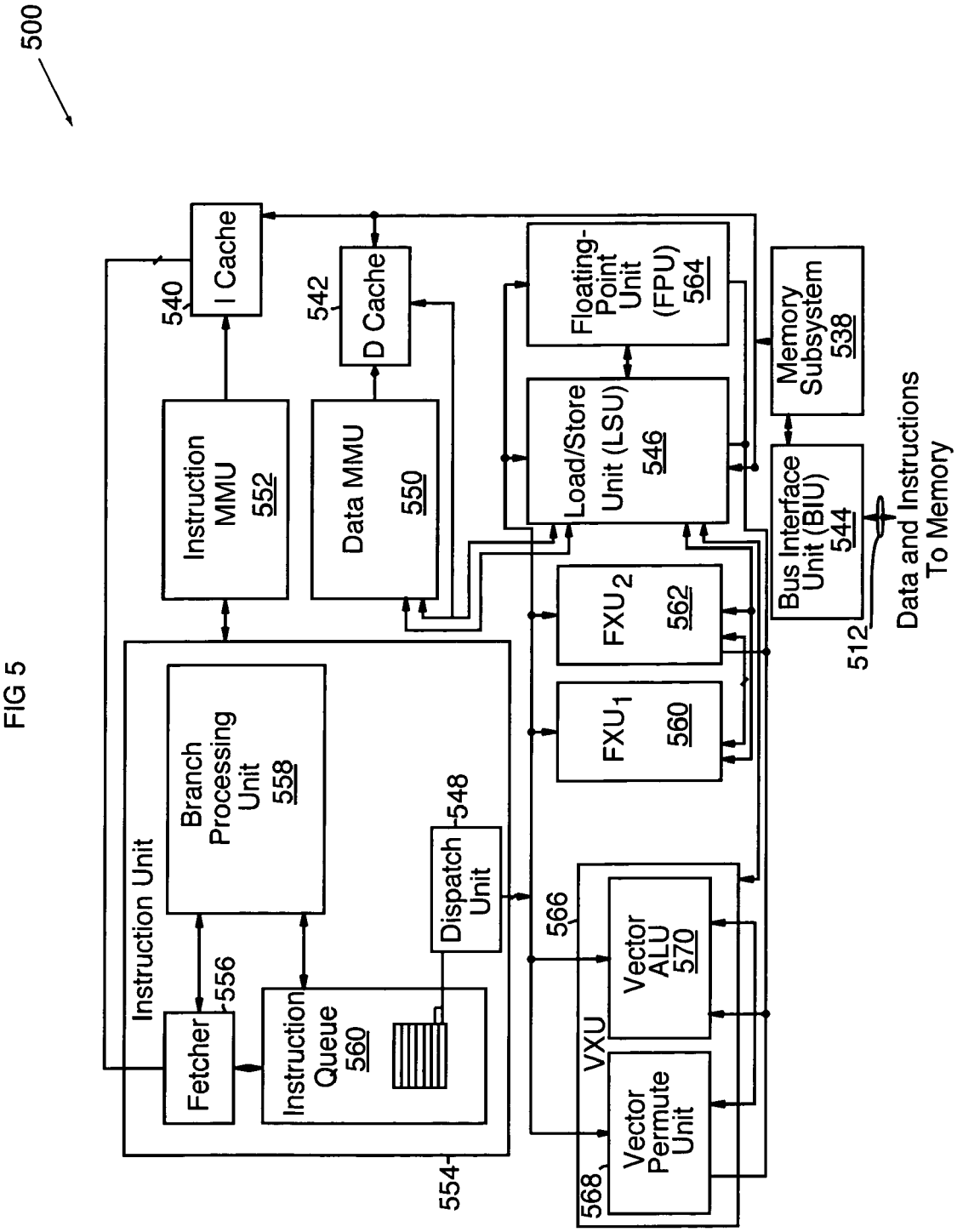
FIG. 5 depicts an embodiment of a processor utilizing a PLL circuit such as the PLL circuit in FIG. 1.

Referring now to FIG. 5, there is shown a high-level functional block diagram of selected operational blocks that may be included in a central processing unit (CPU) 500. In the illustrated embodiment, CPU 500 includes internal instruction cache (I-cache) 540 and data cache (D-cache) 542 which are accessible to memory (not shown in FIG. 5) through bus 512, bus interface unit 544, memory subsystem 538, load/store unit 546 and corresponding memory management units: data MMU 550 and instruction MMU 552. In the depicted architecture, CPU 500 operates on data in response to instructions retrieved from I-cache 540 through instruction dispatch unit 548. Dispatch unit 548 may be included in instruction unit 554 which may also incorporate fetcher 556 and branch processing unit 558 that controls instruction branching.

An instruction queue 560 may interface fetcher 556 and dispatch unit 548. In response to dispatched instructions, data retrieved from D-cache 542 by load/store unit 546 can be operated upon by one of fixed point unit (FXU) 560, FXU 562 or floating point execution unit (FPU) 564. Additionally, CPU 500 provides for parallel processing of multiple data items via vector execution unit (VXU) 566. VXU 566 may include a vector permute unit 568 that performs permutation operations on vector operands, and a vector arithmetic logic unit (VALU) 570 that performs vector arithmetic operations such as fixed-point and floating-point operations on vector operands.

Each unit, such as instruction unit 554, VXU 566, FXUs 560 and 562, LSU 546, and FPU 564, along the instruction pipelines, are enabled and synchronized by a clock signal such as the PLL clock signal 160 output by the PLL circuit 100 as described in FIG. 1.

Figure 6:
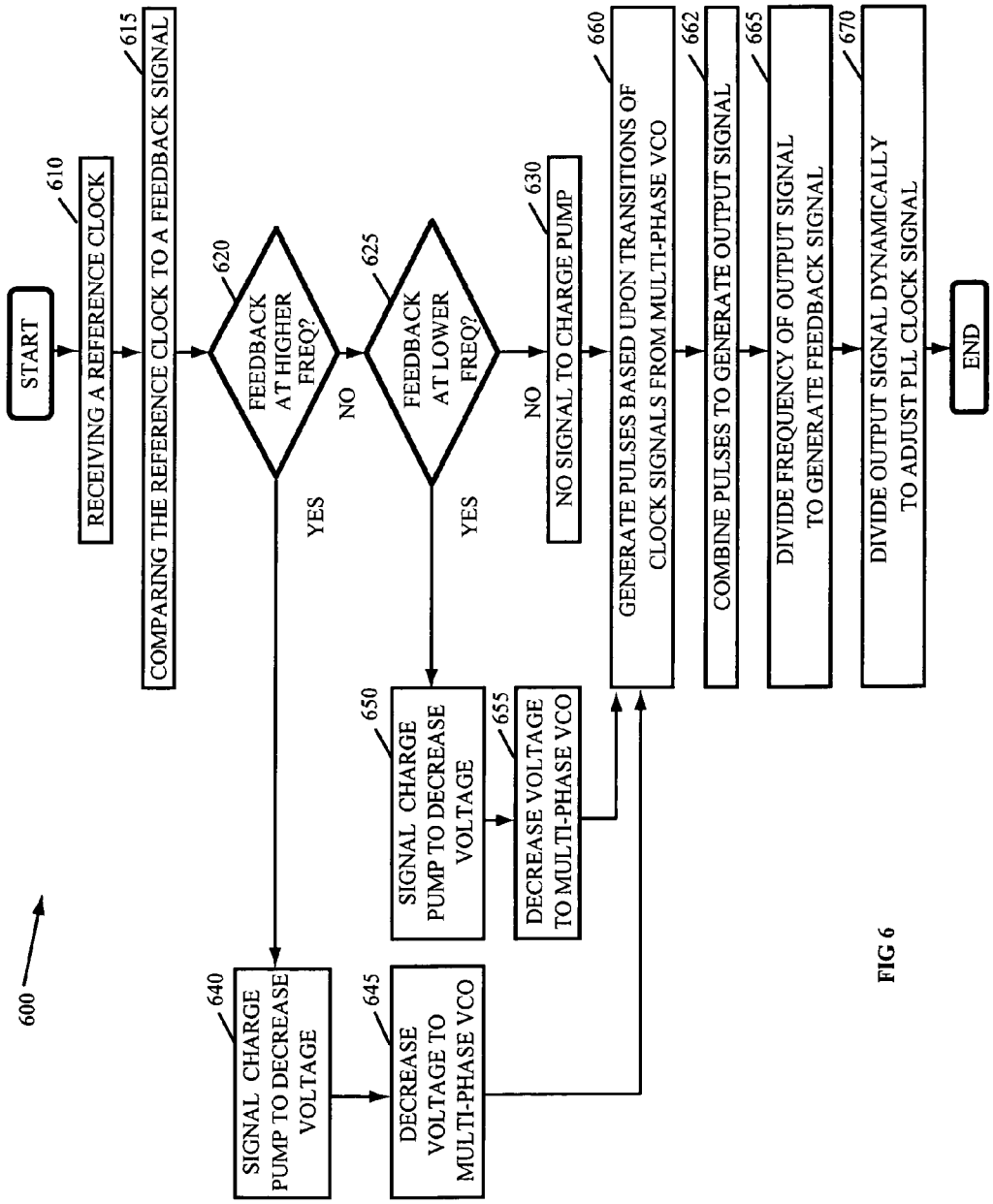
FIG. 6 depicts an example of a flow chart to reduce power consumption and enhance the speed of a PLL circuit such as the PLL circuit in FIG. 1.

Referring now to FIG. 6, there is shown an example of a flow chart 600 for a low power PLL such as the PLL circuit 100 shown in FIG. 1. Flow chart 600 begins with receiving a reference clock signal (element 610). For example, the reference clock signal may include a signal from a bus or a multiplied signal from a bus coupled with a processor. The bus frequency or a multiple of that bus frequency may then be used as a reference clock to generate an internal clock signal for the processor with a PLL circuit like PLL circuit 100.

After receiving the reference clock signal, the reference clock signal is compared with a feedback signal (element 615) that is indicative of the frequency of the clock signal output by the PLL circuit. If the feedback signal has a higher frequency than the reference signal (element 620) then a decrease signal is transmitted to a charge pump to decrease the charge output by the charge pump (element 640). As a result, the charge pump reduces the voltage at the input of a multi-phase VCO (element 645).

On the other hand, if the feedback signal is not a higher frequency than the reference clock signal (element 620) but is a lower frequency than the reference clock signal (element 625) then an increase signal is transmitted to the charge pump to increase the output voltage of the charge pump (element 650). The charge pump may then respond to the increase signal by increasing the voltage at the input of the multi-phase VCO (element 655).

Otherwise, when the feedback signal matches the reference clock signal fairly closely, no increase or decrease signal may be transmitted to the charge pump (element 630). In some embodiments, a signal may be transmitted to the charge pump indicating that no change may be made to the output voltage of the charge pump.

After the charge pump increases, decreases, or maintains the voltage at the input of the multi-phase VCO, a pulse generator like the pulse generator 130 of FIG. 1, generates pulses based upon transitions of the various phases of a clock signal output by the multi-phase generator (element 660). In particular, the pulse generator may generate pulses based upon rising edges and/or falling edges of the clock signals output by the multi-phase VCO. In further embodiments, other triggers may be used instead of or in addition to the rising and falling edges of the clock signals output by the multi-phase VCO.

The pulse generator may then combine the pulses (element 662) to form a single clock signal to output and that output may be divided by a fast frequency divider to generate a feedback signal (element 665). The fast frequency divider may include an n-bit frequency divider implemented via dynamic logic such as the frequency divider circuit 300 of FIG. 3.

In several embodiments, the single clock signal output by the pulse generator may be the output of the PLL circuit. In the present embodiment, the clock signal is output via a frequency divider to dynamically adjust the PLL output clock signal (element 670), as desired for other circuit functions.

It will be apparent to those skilled in the art having the benefit of this disclosure that the present invention contemplates methods and arrangements for a low power PLL, especially for a low power PLL having a capability of producing higher frequencies than PLLs implementing single phase VCOs. It is understood that the form of the invention shown and described in the detailed description and the drawings are to be taken merely as examples. It is intended that the following claims be interpreted broadly to embrace all the variations of the example embodiments disclosed.

What is claimed is:

1. A phase-locked loop circuit, comprising:
    a multi-phase oscillator to generate more than one phases of an oscillator signal responsive to an input signal;
    a pulse generator coupled with the multi-phase oscillator to combine, via OR gate logic, pulses generated in response to a transition of a phase of the more than one phases of the oscillator signal to generate a loop clock signal, which is a multiple of the oscillator signal and related to the number of phases; and
    a comparison circuit coupled with the pulse generator to modify the input signal based upon a comparison of the loop clock signal with a reference clock signal.

2. The phase-locked loop circuit of claim 1, further comprising an output frequency divider coupled with the pulse generator to dynamically modify the loop clock signal to generate an output clock signal.

3. The phase-locked loop circuit of claim 2, wherein the output frequency divider comprises a output decrementer circuit with an output pulse latch to count transitions of the loop clock signal and transition a voltage latched to an output of the pulse latch between a high voltage and a low voltage to generate the output clock signal.

4. The phase-locked loop circuit of claim 1, wherein the multi-phase oscillator comprises a voltage controlled, ring oscillator circuit.

5. The phase-locked loop circuit of claim 1, wherein the transition of the phase comprises a rising edge.

6. The phase-locked loop circuit of claim 1, wherein the pulse generator comprises OR gate logic to combine pulses generated for each phase.

7. The phase-locked loop circuit of claim 1, wherein the comparison circuit comprises a frequency divider coupled with the pulse generator to generate a feedback control signal having a frequency comparable to a frequency associated with the reference clock signal.

8. The phase-locked loop circuit of claim 7, wherein the frequency divider comprises a feedback decrementer circuit with a feedback pulse latch to count transitions of the loop clock signal and toggle an output based upon a count of the transitions, wherein toggling the output generates the feedback signal.

9. A method for generating an output clock signal based upon a reference clock signal, the method comprising:
    generating phases of an oscillator signal in response to an input voltage, wherein the input voltage results from a comparison of the output clock signal and a reference clock signal;
    generating pulses in response to transitions associated with the phases of the oscillator signal; and
    combining the pulses with OR gate logic to generate the output clock signal, the output clock signal being a multiple of the oscillator signal and related to the number of phases of the oscillator signal.

10. The method of claim 9, wherein further comprising dynamically adjusting a frequency of the output clock signal.

11. The method of claim 9, wherein generating phases comprises dividing the output clock signal to generate a feedback signal having a frequency comparable to a frequency of the reference clock signal to determine the input voltage.

12. The method of claim 9, wherein generating pulses comprises generating a pulse based upon rising edges of the phases of the oscillator signal.

13. A system comprising:
    an instruction unit of an instruction pipeline for performing operations on operands; and
    a phase-locked loop circuit coupled with the instruction unit to output a pipeline clock signal to enable the instruction unit and to synchronize operations performed by the instruction unit with operations performed by other units along the instruction pipeline, the phase-locked loop being adapted to generate more than one phases of an oscillator signal responsive to an input signal; to combine pulses generated in response to a transition of a phase of the more than one phases of the oscillator signal via OR gate logic to generate a loop clock signal, which is a multiple of the oscillator signal and related to the number of phases; and to modify the input signal based upon a comparison of the loop clock signal with the reference clock signal.

14. The system of claim 13, wherein the phase-locked loop circuit comprises an output frequency divider to divide the loop clock signal to generate the pipeline clock signal.

15. The system of claim 14, wherein the output frequency divider is adapted to divide the loop clock signal by a first divisor, the first divisor being based upon a difference in frequency between the reference clock signal and a designed pipeline frequency.

16. The system of claim 13, wherein the phase-locked loop circuit comprises a feedback-loop frequency divider to divide the loop clock signal by a second divisor to compare the loop clock signal with the reference clock signal.

17. The system of claim 16, wherein the feedback-loop frequency divider comprises:
    a latch to receive the second divisor, wherein the second divisor comprises at least one bit;
    a decrementer circuit to count a number of transitions of the loop clock signal and to output a pulse when the number reaches the second divisor, and
    a pulse latch circuit to transition an output voltage in response to receipt of the pulse, to generate an output clock signal having a frequency of the loop clock signal divided by the second divisor.

18. The system of claim 17, wherein the decrementer circuit comprises a multiplexer to decrement a divisor count from the second divisor to zero and, upon reaching zero, to reload the divisor count via the latch.

19. The system of claim 17, wherein the pulse latch circuit comprises an inverter to invert the output voltage, a first latch to latch the inverted output voltage in response to a pulse from the decrementer circuit, and a second latch to latch the voltage latched at the first latch in response to a transition of the loop clock signal.

* * * * *